United States Patent [19]

Capasso

[11] Patent Number: 4,486,765

[45] Date of Patent: Dec. 4, 1984

[54] AVALANCHE PHOTODETECTOR INCLUDING MEANS FOR SEPARATING ELECTRONS AND HOLES

[75] Inventor: Federico Capasso, Westfield, N.J.

[73] Assignee: AT&T Bell Laboratories, Murray Hill, N.J.

[21] Appl. No.: 389,908

[22] Filed: Jun. 18, 1982

Related U.S. Application Data

[63] Continuation-in-part of Ser. No. 328,385, Dec. 7, 1981, abandoned.

[51] Int. Cl.³ .............................................. H01L 29/90
[52] U.S. Cl. ......................................... 357/13; 357/4; 357/30; 357/16
[58] Field of Search .......................... 357/13, 4, 16, 30

[56] References Cited

U.S. PATENT DOCUMENTS

| | | | |
|---|---|---|---|
| 3,783,351 | 1/1974 | Tsukada et al. | 317/235 |
| 4,103,312 | 7/1978 | Chang et al. | 357/16 |
| 4,203,124 | 5/1980 | Gordon | 357/13 |
| 4,250,516 | 2/1981 | Worlock | 357/13 |
| 4,257,055 | 3/1981 | Hess | 357/4 |
| 4,258,375 | 3/1981 | Hsieh | 357/13 |
| 4,348,686 | 9/1982 | Esaki | 357/4 |

OTHER PUBLICATIONS

Capasso et al., International Electron Device Meeting, Wash., D.C., (Dec. 7-9, 1981), The Superlattice Photodetector, pp. 284-286.
R. J. McIntyre, "Multiplication Noise in Uniform Avalanche Diodes," *IEEE Transactions on Electron Devices*, vol. ED-13, No. 1, Jan. 1966, pp. 164-168.
S. M. Sze, *Physics of Semiconductor Devices*, John Wiley and Sons, Inc., 1969, pp. 84-90.
G. H. Dohler et al., "Periodic Doping Structure in GaAs," *Prog. Crystal Growth Charact.*, vol. 2, 1979, pp. 145-168.
G. H. Dohler, "Doping Superlattices," *Journal of Vacuum Science and Technology*, vol. 16, No. 3, May/Jun. 1979, pp. 851-856.
K. Ploog et al., "Novel Periodic Doping Structures in GaAs Grown By Molecular Beam Epitaxy," *Inst. Phys. Conf. Ser. No. 56: Chapter 9, Gallium Arsenide and Related Compounds*, 1980, pp. 721-730.

Primary Examiner—Martin H. Edlow
Attorney, Agent, or Firm—Richard D. Laumann

[57] ABSTRACT

The invention is a reduced noise avalanche photodetector in which the energy band structure causes one type of charge carrier to ionize at a faster rate than the other type of charge carrier.

In a preferred embodiment the inventive structure comprises a relatively narrow bandgap semiconductor layer of a first conductivity type located contiguous with and between two relatively wider bandgap layers of a second conductivity type. Means are provided for applying an electric field parallel to the plane of the layers.

In a preferred mode of operation, light is absorbed in the narrow bandgap layer and charge carriers are generated in response thereto. One type of charge carrier is confined to the narrow bandgap layer and undergoes avalanche multiplication therein in a direction parallel to the applied field. The other type of charge carrier is swept out into the wider bandgap layers where avalanche multiplication takes place at a negligible rate.

17 Claims, 3 Drawing Figures

AVALANCHE PHOTODETECTOR INCLUDING MEANS FOR SEPARATING ELECTRONS AND HOLES

CROSS REFERENCE TO RELATED APPLICATION

This application is a continuation-in-part of my copending application, Ser. No. 328,385, filed Dec. 7, 1981, now abandoned.

TECHNICAL FIELD

This invention pertains to the field of photodetectors and more particularly to the field of reduced noise avalanche photodetectors as well as semiconductor structures useful as, for example, photodetectors having a capacitance varying with incident power, low capacitance p-i-n diodes and varactors.

BACKGROUND OF THE INVENTION

In a semiconductor avalanche photodetector, the noise depends in part upon the ratio of the ionization rates of the two types of charge carriers present in semiconductor devices and on the mechanism which initiates carrier multiplication. The ionization rate is the average number of ionizing collisions a carrier undergoes per unit path length traveled. A large difference between the ionization rates of the electrons and holes results in desirable noise characteristics for an avalanche photodetector. Preferably, the avalanche is initiated by the charge carrier having the larger ionization rate, however significant reduction in noise can be achieved as long as the smaller ionization rate is negligible compared to the larger ionization rate. In the ideal avalanche detector, only one type of charge carrier would undergo ionizing collisions. (See McIntyre, R. J., *IEEE Transactions on Electron Devices*, Vol. 13, p. 194 (1966).)

In contrast with silicon, many group III-V semiconductor materials exhibit ionization rates for electrons and holes which do not significantly differ. Accordingly, efforts have been directed to tailoring the structure of an avalanche photodetector comprising group III-V or other semiconductors so that substantial noise reduction is achieved in accordance with the above-described physical principles.

SUMMARY OF THE INVENTION

This invention is an avalanche photodetector in which the energy band structure is arranged to cause one type of charge carrier to ionize at a significantly larger rate than the other type of charge carrier, thereby achieving detector operation at reduced noise levels.

In accordance with the principles of the present invention, an avalanche photodetector advantageously comprises at least one relatively narrow bandgap semiconductor layer of a first conductivity type in which avalanche multiplication of charge carriers generated by the absorption of the radiation to be detected takes place. The relatively narrow bandgap layer is located between and contiguous with a pair of wider bandgap semiconductor layers of a conductivity type opposite to the first conductivity type. The inventive avalanche photodetector also includes a means for applying an electric field parallel to the plane of the layers. Illustratively, the means for applying the electric field parallel to the plane of the layers comprises a $p^+$-type region which extends transversely to the layers and an $n^+$-type region which is spaced apart from the $p^+$-type region and which also extends transversely to the layers. In order to achieve an electric field which has a direction parallel to the plane of the layers in the region between the $p^+$-type region and the $n^+$-type region and which has a magnitude sufficient to cause avalanche multiplication, an external voltage source may be used to apply an appropriate reverse bias voltage between the $p^+$-type and $n^+$-type regions.

The structures are also useful as high sensitivity capacitive optical detectors. At very low bias levels, typically 1 to 3 volts, capacitance variations larger than 1.0 are easily obtained. The structures are further useful as low capacitance p-i-n diodes and varactors.

In a particular embodiment of the invention, the semiconductor layers comprise group III-V compounds. Illustratively, the relatively narrow bandgap region comprises GaAs, one of the wider bandgap layers comprises $Al_xG_{1-x}As$, $0 < x \leq 1$, and the other of the wider bandgap layers comprises $Al_yGa_{1-y}As$, $0 < y \leq 1$. Typically, the $p^+$-type region is doped using magnesium, beryllium, or zinc and the $n^+$-type region is doped using silicon.

It should also be noted that in a particular embodiment of the invention, there may be a plurality of relatively narrow bandgap semiconductor layers of a first conductivity type, each of which is located between and contiguous with two wider bandgap semiconductor layers of the opposite conductivity type.

It is hypothesized that the inventive avalanche photodetector operates as follows. For purposes of illustration, it is assumed that the relatively narrow bandgap layer is n-type and the surrounding wider bandgap layers are p-type. Incident radiation of a suitable wavelength is absorbed in the relatively narrow bandgap layer or in the wider bandgap layers thereby causing the generation of hole-electron pairs. The two p-n heterojunctions, formed at the interfaces between the relatively narrow bandgap layer and the surrounding wider bandgap layers, serve to separate the two types of charge carriers. Most of the electrons are confined to the narrow bandgap layer while most of the holes are confined to the wider bandgap layers. The applied electric field, formed when the $p^+$-type region and the $n^+$-type region are appropriately biased by an external voltage source, causes the electrons confined to the narrow bandgap layer to undergo avalanche multiplication therein in a direction parallel to the plane of the layers. Holes generated in the narrow bandgap layer do not undergo avalanche multiplication therein because they are swept out into the wider bandgap layers before experiencing an ionizing collision. The holes in the wider bandgap layers undergo avalanche multiplication at a negligible rate compared to the avalanche multiplication rate of the electrons in the relatively narrow bandgap layer. As a result detector operation at reduced noise levels is achieved.

In an alternative possible mode of operation, the radiation to be detected is absorbed in one of the highly doped regions used to form the electric field parallel to the plane of the layers. Advantageously, the radiation should be absorbed within a few diffusion lengths of the region where avalanche multiplication takes place. In addition, the radiation should be absorbed in that one of the $p^+$ and $n^+$-type regions which results in the injection into the narrow bandgap layer of the type of charge carrier which is confined therein. Again, only the type of charge carrier which is confined undergoes avalanche multiplication in the narrow bandgap layer as the other type of charge carrier is swept out into the surrounding wider bandgap layers. Illustratively, if the narrow bandgap layer is n-type, the radiation to be detected should be absorbed in the p+-type region because in this case electrons are injected into the narrow bandgap n-type region where they undergo avalanche multiplication.

BRIEF DESCRIPTION OF THE DRAWING

For reasons of clarity, the Figures have not been drawn to scale.

DETAILED DESCRIPTION

Figure 1:
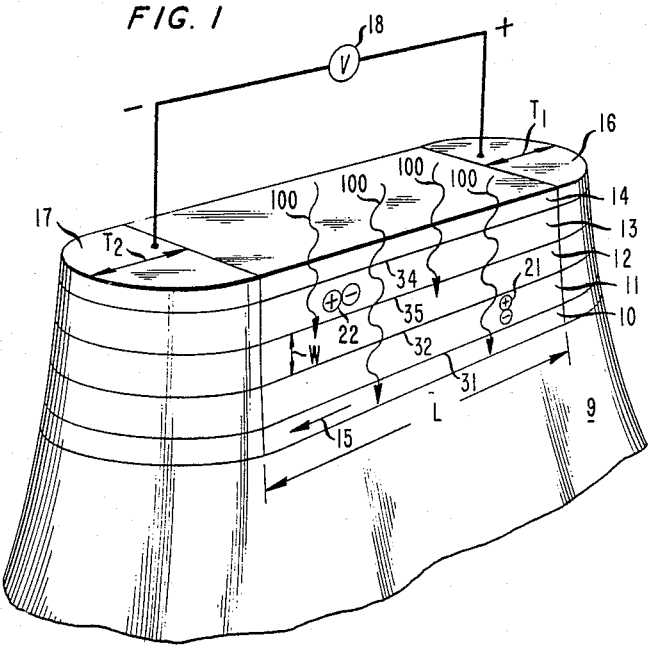
FIG. 1 schematically shows a reduced noise avalanche photodetector in accordance with an illustrative embodiment of the invention.

The photodetector of FIG. 1 includes two relatively narrow bandgap layers, each of which is located between and contiguous with two wider bandgap layers having a conductivity type opposite to the conductivity type of the narrow bandgap layers. A p+-type region and an n+-type region extending transversely to the layers are used to provide an electric field parallel to the plane of the layers. Numerical parameters stated in connection with this embodiment of the invention are intended to be illustrative only, and are not intended to limit the scope of the claimed subject matter.

Turning to FIG. 1, narrow bandgap n-type semiconductor layer 11 is located between and contiguous with wider bandgap p-type layers 10 and 12. Similarly, narrow bandgap n-type semiconductor layer 13 is located between and contiguous with wider bandgap p-type layers 12 and 14. Advantageously, layers 10 through 14 have been epitaxially deposited on semi-insulating substrate 9. n+-type region 16 and p+-type region 17 extend transversely to layers 10, 11, 12, 13, and 14 at opposite ends thereof. When a voltage source 18 is connected to bias, p+-type region 17 negatively with respect to n+-type region 16, an electric field is created parallel to the plane of the layers as indicated by arrow 15. Advantageously, the illustrative embodiment of the invention shown in FIG. 1 has a mesa geometry.

In the illustrative embodiment of the invention shown in FIG. 1, incident radiation 100 passes through the wider bandgap layers, and is absorbed in relatively narrow bandgap layers 11 and 13 where hole electron pairs (e.g., 21 and 22 of FIG. 1) are generated.

Illustratively, the photodetector of FIG. 1 can be formed using the GaAs-AlGaAs materials system. In this case, substrate 9 comprises semi-insulating chromium doped GaAs. The relatively narrow bandgap layers comprise n-type GaAs and the wider bandgap layers comprise p-type $Al_{0.45}Ga_{0.55}As$. Typically, each of layers 11, 12, and 13 is about 2 microns thick and each of layers 10 and 14 is about 1 micron thick. Each of layers 10 through 14 has an excess donor or acceptor concentration of about $5 \times 10^{15}/cm^3$. The surface area of the device is generally on the order of about $10^{-4}/cm^2$. As will be discussed below, these parameters advantageously satisfy the basic physical criteria which lead to superior device performance.

Advantageously, semiconductor layers 10 through 14 are monocrystalline and are epitaxially formed on substrate 9 using a method such as liquid phase epitaxy or molecular beam epitaxy. Typically, n+-type region 16 and p+-type region 17 are formed by ion implanting silicon and magnesium, respectively, in regions whose thicknesses $T_1$ and $T_2$, respectively, are each in the approximate range of 5–50 microns. Each of regions 16 and 17 has an excess donor or acceptor concentration in the approximate range of $10^{17}/cm^{-3}$ to $10^{19}/cm^{-3}$. Alternatively, p+- and n+-type regions may be formed using etching and epitaxial regrowth techniques. In addition a protective layer (not shown) comprising $SiO_2$ or $Si_3N_4$ may be included to protect the exposed surface of layer 14.

Figure 2:
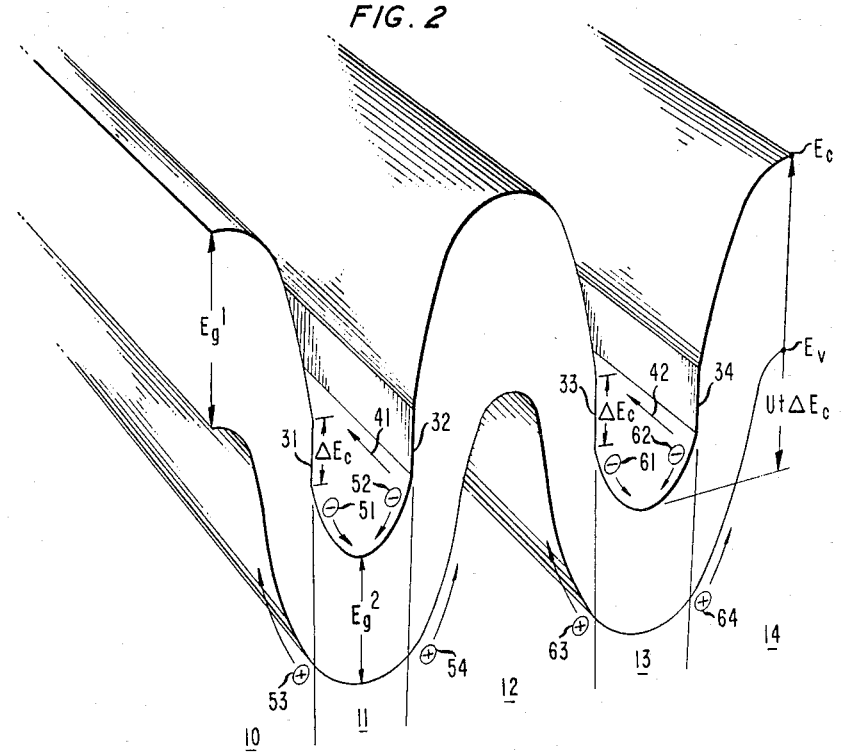
FIG. 2 schematically illustrates the energy band diagram of the structure of FIG. 1 in the presence of an applied electric field parallel to the plane of the layers.

The physics of the illustrative embodiment of the invention shown in FIG. 1 can be understood from the energy band diagram of FIG. 2. It should be noted, however, that the explanation which follows as well as the numerical illustrations which refer to the GaAs-AlGaAs materials system are not intended to limit the scope of the invention.

Zones 10, 11, 12, 13, and 14 of FIG. 2 correspond to layers 10, 11, 12, 13, and 14 of FIG. 1, respectively. In FIG. 2 the minimum conduction band energy is indicated by $E_c$ and the maximum valence band energy is indicated by $E_v$. The wide bandgap layers have a bandgap energy $E_{g1}$, and the narrow bandgap layers have a bandgap energy $E_{g2}$. As indicated in both FIGS. 1 and 2, p-n heterojunctions 31, 32, 33, and 34 are formed at the interfaces between layers 10 and 11, 11 and 12, 12 and 13, and 13 and 14, respectively. The conduction band edge discontinuity at the heterojunction interfaces is $\Delta E_c$.

As previously discussed, the narrow bandgap layers may comprise GaAs and the wider bandgap layers may comprise $Al_{0.45}Ga_{0.55}As$. In this case $E_{g1}$ is approximately 2.0 eV, $E_{g2}$ is approximately 1.5 eV and $\Delta E_c$ is about 0.5 eV. The valence band edge discontinuity at the GaAs-$Al_{0.45}Ga_{0.55}As$ interface is negligible and is not shown in FIG. 2.

In the illustrative embodiment of the invention shown in FIGS. 1 and 2, radiation to be detected is absorbed in narrow bandgap layers 11 and 13 and charge carriers are generated in response thereto. If the narrow bandgap layers comprise GaAs, the radiation can have a wavelength on the order of 0.89 $\mu$m. As indicated in FIG. 2, p-n heterojunctions 31 and 32 form a potential well which tends to confine electrons to narrow bandgap layer 11. Similarly, p-n heterojunctions 33 and 34 form a potential well which tends to confine electrons to narrow bandgap layer 13. Thus, in FIG. 2 electrons 51 and 52 are confined to layer 11, and electrons 61 and 62 are confined to layer 13. Similarly, holes 53 and 54 are swept out of narrow bandgap layer 11 into wider bandgap layers 10 and 12, respectively, and holes 63 and 64 are swept out of narrow bandgap layer 13 into wider bandgap layers 12 and 14, respectively. It should be noted that holes 54 and 63 are confined to wider bandgap layer 12 by a potential well in the valence band formed by p-n heterojunctions 32 and 33.

The "sides" of the potential wells in the conduction band are formed from the electrostatic potentials resulting from the p-n heterojunctions as well as from the conduction band edge discontinuities ($\Delta E_c$). It should be noted that in general the electrostatic potential (U)

resulting from each of the p-n heterojunctions has two components. The first is the built-in potential which is present when there is no bias across the heterojunction. The second component results as follows. In order for there to be an electric field parallel to the plane of the layers, the narrow bandgap and wider bandgap layers should be totally depleted. If the p-n heterojunctions are not sufficient by themselves to totally deplete these layers, the layers will be totally depleted by the p+ and n+ regions shown in FIG. 1 when a reverse bias voltage is supplied by voltage source 18 of FIG. 1 before any electric field parallel to the plane of the layers is produced. When this happens the space charge region on each side of the p-n heterojunction is larger than it would be without the presence of the p+ and n+ regions. This additional space charge results in an electrostatic potential (U) which is larger than the built-in electrostatic potential resulting from the p-n heterojunction in the absence of the appropriately biased p+ and n+ regions. It should also be noted that because the valence band edge discontinuity is negligible for the illustrative embodiment of the invention shown in FIGS. 1 and 2, the potential wells in the valence band, which serve to confine the holes to the wider bandgap layers, are formed almost totally from the electrostatic potentials resulting from the p-n heterojunctions.

The electric field parallel to the plane of layers 10 through 14 is indicated by arrows 41 and 42. This electric field causes the electrons within the narrow bandgap layers to undergo avalanche multiplication in a direction antiparallel to that of the electric field. Advantageously, the holes are swept out of the narrow bandgap layers before undergoing an ionizing collision. In the case when the device comprises alternating GaAs and $Al_{0.45}Ga_{0.55}As$ layers, avalanche multiplication of the holes in the wider bandgap $Al_{0.45}Ga_{0.55}As$ layers takes place at a negligible rate compared to the avalanche multiplication rate of the electrons in the narrow bandgap GaAs layers. The reason for this is that the ionization rate decreases exponentially with increasing bandgap energy. It should be noted, however, that if the avalanche rate of the holes in the wider bandgap layers is too large, deleterious feedback will result (see McIntyre, supra).

In order to achieve superior device performance in the illustrative embodiment of the invention shown in FIGS. 1 and 2, it is desirable that several criteria be met with respect to the device geometry. Firstly, it is advantageous that the avalanche region have a length L (see FIG. 1) which is on the order of 25 to 50 microns so that the device can accommodate an incident radiation beam which has exited from an optical fiber. If the applied reverse bias voltage is on the order of 500 to 1000 volts, the electric field parallel to the plane of the layers is in the approximate range of $2 \times 10^5$ to $4 \times 10^5$ volts/cm. At an electric field of about $2.5 \times 10^5$ volts/cm the ionization rate for electrons ($\alpha$) in GaAs is approximately $1.66 \times 10^3$ cm$^{-1}$, and the ionization rate for holes ($\beta$) in GaAs is about $8.3 \times 10^2$ cm$^{-1}$. Advantageously, if only the electrons undergo avalanche multiplication in the narrow bandgap layers, the gain of the device is equal to $\exp(\alpha L)$. For a device whose avalanche region has a length L of 25 microns and a value of $\alpha$ approximately equal to $1.66 \times 10^3$ cm$^{-1}$, the gain is on the order of 60.

Secondly, in order to insure that only one type of charge carrier undergoes significant avalanche multiplication, it is desirable that the dimensions of the narrow bandgap layers of FIGS. 1 and 2 be chosen so that most of the holes are swept out of the narrow bandgap layers before they undergo an ionizing collision therein. Since the time between ionizing collisions for holes scales as $1/\beta v$, where v is the effective hole velocity, and the time a hole takes to be swept out of a narrow bandgap layer scales as $W/v$, where W is the thickness of the narrow bandgap layer, W is advantageously made smaller than $1/\beta$ in order to insure that most of the holes are swept out of the narrow bandgap layer before undergoing an ionizing collision therein. In the case of GaAs, $\beta^{-1}$ is approximately equal to 12 $\mu$m. Thus, if the narrow bandgap layers have a thickness on the order of about 2 $\mu$m, this criterion is well satisfied.

Thirdly, it is advantageous for device performance if the potential wells in the conduction band are "deep" enough so that the electrons do not escape the narrow bandgap layers before undergoing ionizing collisions. Similarly, the potential wells in the valence band should be "deep" enough to prevent analogous escape of holes from the wide bandgap layers into the narrow bandgap layers. The ionization energy $E_I$ is approximately equal to $(3/2)E_g$ where $E_g$ is the bandgap energy. In the case of GaAs, $E_g$ is about 1.4 eV, and $E_I$ is about 2.1 eV. In the case of $Al_{0.45}Ga_{0.55}As$, $E_g$ is about 2 eV and $E_I$ is about 3 EV.

When the inventive device comprises alternating GaAs and $Al_{0.45}Ga_{0.55}As$ layers as described above, the conduction band potential wells are preferably on the order of 2.1 eV in order to confine the electrons to the narrow bandgap GaAs layers and the valence band potential wells are preferably on the order of 3.0 eV in order to confine holes to the wider bandgap $Al_{0.45}Ga_{0.55}As$ layers. Thus, as long as the electrostatic potential resulting from the p-n heterojunctions is on the order of or larger than 3.0 eV, both the electrons and holes will be confined to the desired layers. Using basic semiconductor physics, it is possible to estimate the electrostatic potential (U) which results when regions of a desired thickness and donor or acceptor concentration (N) are totally depleted. Assuming that layers 10, 11, 12, 13, and 14 have substantially equal donor or acceptor concentrations, and assuming total depletion of the layers which means that the space charge region of each of the p-n heterojunctions has a thickness W/2 on each side of the heterojunction the electrostatic potential (U) is given by the expression $$U = (NW^2 q / 4\epsilon_s) \tag{1}$$

where q is the unit charge ($1.6 \times 10^{-19}$ coul) and $\epsilon_s$ is the dielectric constant which in the case of GaAs is about $1.06 \times 10^{-12}$ F/cm. (See S. M. Sze, "Physics of Semiconductor Devices," John Wiley and Sons, Inc., 1969, pp. 84–90.) Note that W as used in equation (1) corresponds to the thickness of layers 11, 12, and 13 of FIG. 1. However, because layers 10 and 14 are contiguous with only one p-n heterojunction, it is desirable that layers 10 and 14 have a thickness W/2 in order to achieve total depletion of these layers.

In addition, for superior device performance, it is desirable that the maximum electric field perpendicular to the plane of the layers, which is used to sweep one type of charge carrier out of the narrow bandgap layers and confine the other type of charge carrier to the narrow bandgap layers, be small enough so that it does not cause any breakdown (avalanche multiplication or tunneling) perpendicular to the plane of the layers. This criteria is satisfied when $$(q/2\epsilon_s)NW < E_B \qquad (2)$$

where $E_B$ is the minimum electric field necessary to cause breakdown (about $10^5$ V/cm in the case of GaAs).

The criteria represented by equations 1 and 2 are satisfied for the GaAs-Al$_{0.45}$Ga$_{0.55}$As structure described above when N is about $5 \times 10^{15}$ cm$^{-3}$ and W is in the approximate range 1.25 to 2.5 $\mu$m. When N is about $5 \times 10^{15}$/cm$^{-3}$ and W is about 1.0 $\mu$m, the electrostatic potential U is about 3.0 volts. Alternatively, when N is about $5 \times 10^{15}$/cm$^{-3}$ and W is about 2.6 $\mu$m, the electrostatic potential U is about 13.5 volts.

Figure 3:
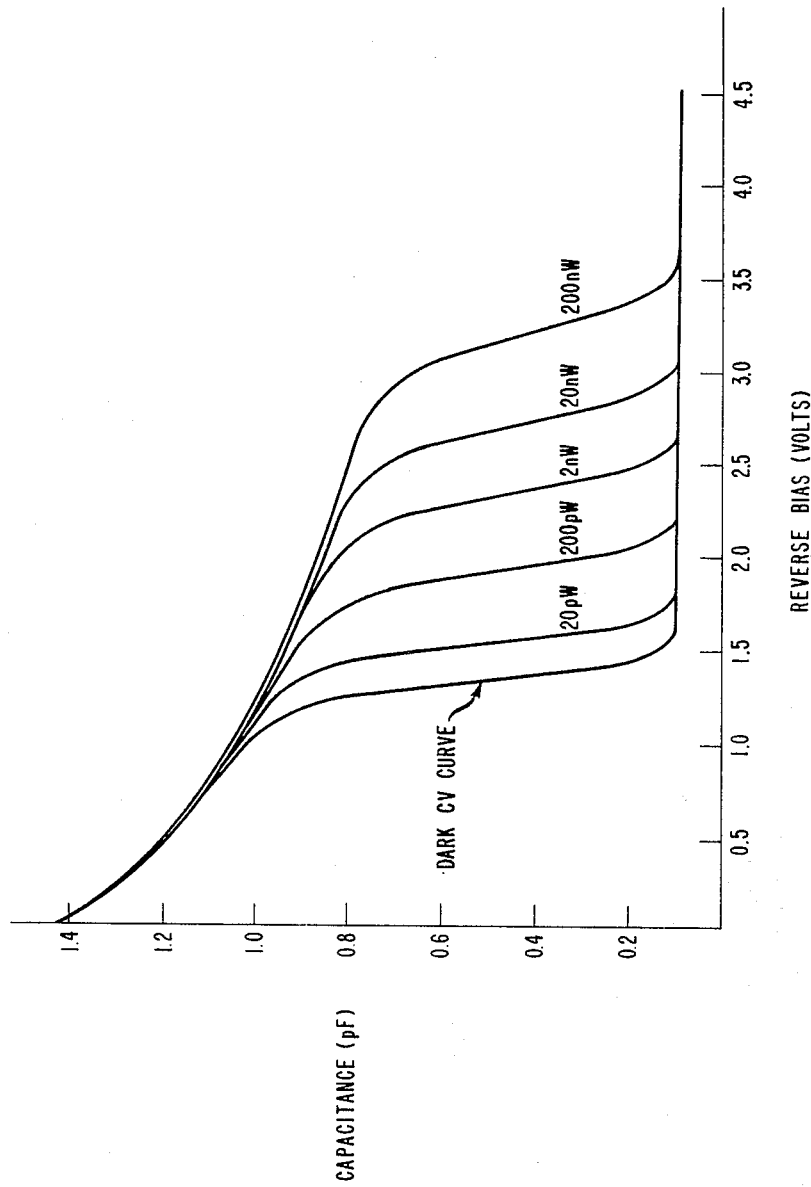
FIG. 3 is a plot of the reverse bias in volts, horizontally, versus capacitance in pF, vertially, for different incident optical power levels.

The structures described may also be used for purposes other than an avalanche photodetector. For example, the structures are useful as a varactor or as a high sensitivity capacitive optical detector. When the structure is operated at low bias voltage, typically less than 3 volts, the capacitance varies with the incident optical power level. This is shown in FIG. 3 for a three layer structure having an n-type layer between two p-type layers. The p-type layers comprised Al$_{0.45}$Ga$_{0.55}$As and the n-type layers comprised GaAs. The center layer was 1.4 $\mu$m thick and the p-type layers were 0.7 $\mu$m. The doping concentrations were between $5 \times 10^{15}$/cm$^3$ and $5 \times 10^{16}$/cm$^3$. FIG. 3 plots the bias voltage horizontally versus the capacitance vertically for several incident power levels. As can be seen, an incident power level of 200 pW produces a capacitance variation of 0.8 pF when the detector is biased above two volts.

At zero bias, the layers are only partially depleted on both sides of the heterointerfaces and the structure appears as a single interdigitated p-n junction. When a reverse bias is applied between the p$^+$ and n$^+$ regions, the depletion width on both sides of the heterointerface increases until the p and n layers are completely depleted. At the reach-through voltage, the capacitance drops to a very low value which is characteristic of a p$^+$-i-n$^+$ diode formed by the p$^+$, n$^+$, and depleted regions. To obtain a large drop in capacitance over a small voltage range, it is not necessary that all layers be completely depleted. For example, if the n layer depletes, there will be a large change in capacitance for the structure discussed.

When the structure is biased slightly above punch-through and light is incident on the structure, the photogenerated electrons and holes are spatially separated in the depleted n and p layers and thereby partially neutralize the space charge. This produces a large increase in capacitance. This large increase together with the long recombination time due to the spatial separation of electrons and holes is responsible for the high device sensitivity.

The n and p layers, when the structure operates as a varactor or a capacitive optical detector, should not be completely depleted at zero bias. In general, for the largest variation in capacitance, $N_D$ should equal $N_A$, $d_n$ should equal $d_p$ except for the top and bottom layers which should have half the thickness of the intermediate layer or layers, or $N_D d_n = N_A d_p$ with the top and bottom layers having the appropriate thicknesses and doping concentration. $N_D$ and $N_A$ are the donor and acceptor concentrations, respectively, and $d_n$ and $d_p$ are the thicknesses of the n-type and p-type layers, respectively. It will be readily appreciated that an even number of layers, as well as an odd number, may be in the structure. Other combinations of layer thickness and doping concentrations will be readily thought of by those skilled in the art.

The aspect ratio should also be considered in constructing devices. The length, i.e., the distance between the n$^+$ and p$^+$ regions, of the layers is desirably greater than the thickness, because as the aspect ratio becomes larger, the variation in capacitance increases.

The structure is, as is evident from FIG. 3, also useful as a p-i-n diode having, for example, low capacitance and low punch-through voltage. Unlike the conventional p-i-n diode, the capacitance does not depend on the size of the photosensitive area between the p$^+$ and the n$^+$ regions or the doping of the layers. A large thickness of material may be depleted with a low punch-through voltage at moderate, for example, approximately $10^{16}$–$10^{18}$/cm$^3$, doping levels because of the interdigitated geometry.

Finally, it is to be understood that the above-described devices are only illustrative of the principles of the present invention. In accordance with these principles, numerous structural configurations may be devised by those skilled in the art without departing from the spirit and scope of the invention.

For example, the above-described devices may be formed using material systems other than the GaAs-AlGaAs materials system, such as the Al$_x$Ga$_{1-x}$As$_x$,S$_{b1-x}$, $0 \leq x \leq 1, 0 \leq x' \leq 1$ materials system and the In$_y$Ga$_{1-y}$As$_y$,P$_{1-y}$, $0 \leq y \leq 1, 0 \leq y' \leq 1$ materials system.

In addition, instead of using the geometry of FIG. 1, a ring geometry may be used to practice the principles of the invention. In this case the alternating wider and narrower bandgap layers are substantially circular in shape. One of the p$^+$-type and n$^+$-type regions is formed near the center of the circularly shaped device and the other of the p$^+$-type and n$^+$-type regions is an annular region formed near the periphery of the circularly shaped device. In this case, avalanche multiplication of confined charge carriers takes place in the radial direction. Furthermore, an avalanche photodetector having only a single n-type layer and a single p-type layer may be fabricated.

What is claim is:

1. In a semiconductor avalanche device for detecting radiation, a monocrystalline semiconductor body comprising:
   a relatively narrow bandgap semiconductor layer of a first conductivity type in which avalanche multiplication of charge carriers generated by the absorption of radiation to be detected takes place;
   a pair of wider bandgap semiconductor layers of a conductivity type opposite to said first conductivity type, said narrow bandgap layer being located between and contiguous with said wider bandgap layers; and
   means for applying an electric field to said body parallel to the plane of said layers.

2. The photodetector of claim 1 wherein said means for applying said electric field comprises:
   a p$^+$-type region which extends transversely to said layers; and
   an n$^+$-type region which is spaced apart from said p$^+$-type region and which extends transversely to said layers.

3. The photodetector of claim 2 wherein said radiation is absorbed in said narrow bandgap layer.

4. The photodetector of claim 2 wherein said radiation is absorbed in one of said p$^+$ and n$^+$-type regions.

5. The photodetector of claim 2 wherein said semiconductor layers comprise group III-V compounds.

6. The photodetector of claim 5 wherein:
said at least one relatively narrow bandgap layer comprises GaAs;
one of said wider bandgap layers comprises $Al_xGa_{1-x}As$, $0 < x \leq 1$; and
the other of said wider bandgap layers comprises $Al_yGa_{1-y}As$, $0 < y \leq 1$.

7. The photodetector of claim 6 wherein said $p^+$-type region is doped using magnesium or beryllium, and said $n^+$-type region is doped using silicon.

8. In a semiconductor avalanche device for detecting radiation, a monocrystalline semiconductor body comprising:
a semiconductor layer in which avalanche multiplication of carriers generated by the absorption of radiation to be detected takes place;
first means for applying an electric field perpendicular to said layer; and
second means for applying an electric field parallel to said layer.

9. The detector of claim 8 wherein said first means comprises a pair of p-n heterojunctions, each of which is contiguous with said layer.

10. A semiconductor device comprising:
a plurality of alternating p-type and n-type semiconductor regions;
a $p^+$-type zone extending transversely to said regions;
an $n^+$-type zone spaced apart from said $p^+$-type zone and extending transversly to said regions; and
means for biasing said $p^+$-type zone negatively with respect to said $n^+$-type zone.

11. A device as recited in claim 10 in which said regions have different bandgaps.

12. In a semiconductor device, a monocrystalline semiconductor body comprising:
a first semiconductor layer of a first conductivity type;
at least one second semiconductor layer of a conductivity type opposite to said first conductivity type, said second layer being contiguous with said first layer; and
means for applying an electric field to said body parallel to the plane of said layers.

13. A device as recited in claim 12 comprising at least two of said second semiconductor layers, said first layer being located between and contiguous with said second layers.

14. A device as recited in claim 12 or 13 in which said first semiconductor layer has a relatively narrow bandgap and said second semiconductor layer has a wider bandgap.

15. A device as recited in claim 14 wherein said means for applying said electric field comprises:
a $p^+$-type region which extends transversely to said layers; and
an $n^+$-type region which is spaced apart from said $p^+$-type region and which extends transversely to said layers.

16. A device as recited in claim 15 wherein said semiconductor layers comprise Group III-V compounds.

17. A device as recited in claim 16 wherein:
said at least one relatively narrow bandgap layer comprises GaAs;
one of said wider bandgap layers comprises $Al_xGa_{1-x}As$, $0 < x \leq 1$; and
the other of said wider bandgap layers comprises $Al_yGa_{1-y}As$, $0 < y \leq 1$.

* * * * *